United States Patent
Nentwig et al.

(10) Patent No.: US 9,172,392 B2
(45) Date of Patent: Oct. 27, 2015

(54) TRANSMITTER NOISE SHAPING

(71) Applicant: Broadcom Corporation, Irvine, CA (US)

(72) Inventors: Markus Nentwig, Helsinki (FI); Petri Tapani Eloranta, Espoo (FI)

( * ) Notice: Subject to any disclaimer, the term of this patent is extended or adjusted under 35 U.S.C. 154(b) by 0 days.

(21) Appl. No.: 14/321,997

(22) Filed: Jul. 2, 2014

(65) Prior Publication Data

US 2015/0009058 A1   Jan. 8, 2015

(30) Foreign Application Priority Data

Jul. 2, 2013   (GB) .................................. 1311823.7

(51) Int. Cl.
*H03M 1/66* (2006.01)
*H03M 3/00* (2006.01)

(52) U.S. Cl.
CPC ........................................ *H03M 3/50* (2013.01)

(58) Field of Classification Search
CPC .............................. H03M 1/0617; H03M 3/50
USPC .................................... 341/143, 144, 118, 120
See application file for complete search history.

(56) References Cited

U.S. PATENT DOCUMENTS

| | | | |
|---|---|---|---|
| 5,977,899 A * | 11/1999 | Adams ........................... | 341/145 |
| 7,321,327 B1 * | 1/2008 | San et al. ...................... | 341/144 |
| 2007/0152859 A1 | 7/2007 | Reefman | |
| 2009/0251346 A1 | 10/2009 | Kwan | |
| 2011/0018753 A1 | 1/2011 | Lou et al. | |
| 2012/0242521 A1 | 9/2012 | Kinyua | |

OTHER PUBLICATIONS

Norsworthy, S.R.; Rich, D.A.; Viswanathan, T.R.; "A Minimal Multibit Digital Noise Shaping Architecture"; Circuits and Systems, 1996 ISCAS '96., Connecting the World., 1996 IEEE International Symposium on, vol. 1, no., pp. 5,8 vol. 1, May 12-15, 1996 (4 pages).

* cited by examiner

*Primary Examiner* — Peguy Jean Pierre
(74) *Attorney, Agent, or Firm* — Oblon, McClelland, Maier & Neustadt, L.L.P.

(57) ABSTRACT

Embodiments of the disclosed invention address a method, apparatus and computer program product for enabling enhanced transmitter noise shaping. Thereby, a first digital-to-analog conversion is performed on a digital signal resulting in first analog signal, a noise shaping on the digital signal is performed for obtaining a noise shaped signal and performing a second digital-to-analog conversion on the noise shaped signal resulting in a second analog signal, and the first analog signal and the second analog signal are added for obtaining an output signal.

20 Claims, 9 Drawing Sheets

PRIOR ART

TRANSMITTER NOISE SHAPING

FIELD OF THE INVENTION

Embodiments of the present invention generally relates to noise shaping in a direct digital transmitter for use e.g. in wired or wireless communication network elements. More particularly, embodiments of the present invention address an apparatus, method and computer program product for enabling enhanced transmitter noise shaping.

BACKGROUND

In general, transceivers which may be applied for communication issues comprise a transmitter and a receiver that may operate simultaneously on different frequencies in FDD (Frequency Division Multiplex) systems, such as WCDMA (Wideband Code Division Multiple Access) or LTE (Long Term Evolution). Embodiments of the present invention relate particularly to transceivers for mobile wireless application.

In the forthcoming future, transmitters are expected to use a full-digital solution. In particular, in a transmitter based on a direct digital-to-RF conversion technique a conventional analog baseband filtering is not possible due to the missing analog baseband domain. In order to achieve a required floor noise at the own receiver Rx in an FDD system, the quantization noise needs to be attenuated into a lower level than in a conventional D/A converter by digital noise shaping.

However, digital noise shaping requires excess bandwidth, where the quantization noise can be processed. Such processing facilitates the more excess bandwidth is available.

A problem is that performing the noise shaping at a high rate with the full bit width of the transmitted signal is computationally expensive. That is, digital multiplier cost is largely proportional to the square of the bit width.

Further, simply noise shaping the whole signal before D/A conversion is not attractive, as it would require running the whole converter at a rather high sampling rate.

Hence, there is the need to avoid/reduce the problems mentioned above in transmitter noise shaping.

The following references may be relevant to the teachings herein:

"A Fully Digital 65 nm CMOS Transmitter for the 2.4-to-2.7 GHz WiFi/WiMAX Bands using 5.4 GHz ΔΣ RF DACs"; Pozsgay, Andreas; Solid-State Circuits Conference, 2008. ISSCC 2008. Digest of Technical Papers. IEEE International "Oversampling Interpolating DACs"; Kester, Walt; ANALOG DEVICES MT-017 TUTORIAL "Noise Shaping"; Nentwig, Markus; DSP blog at DSPrelated.com P. Eloranta, P. Seppinen, "Direct-Digital RF-Modulator IC in 0.13 um CMOS for Wide-Band Multi-radio Applications", in ISSCC Dig. Tech. papers, February 2005, pp. 532-615.

BRIEF DESCRIPTION OF THE DRAWINGS

For a more complete understanding of example embodiments of the present invention, reference is now made to the following descriptions taken in connection with the accompanying drawings in which.

DETAILED DESCRIPTION

Figure 1:
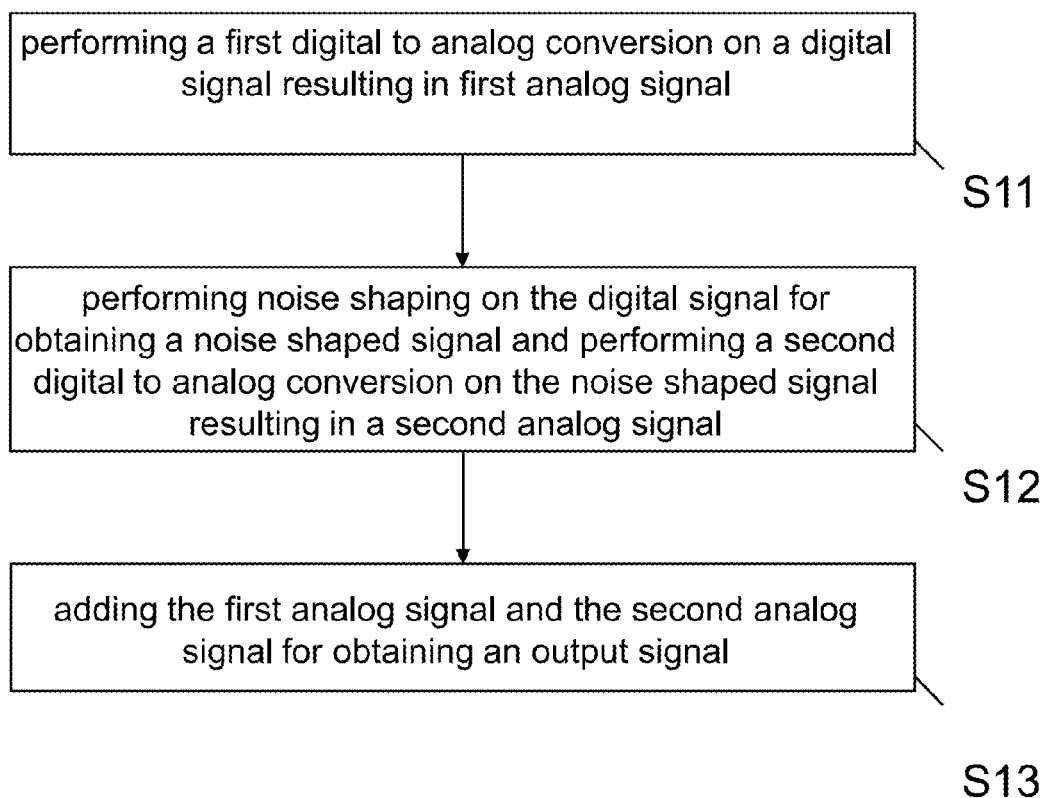
FIG. 1 shows a principle flowchart of an example for a method according to certain embodiments of the present invention.

Exemplary aspects of the present invention will be described herein below. More specifically, exemplary aspects of the present are described hereinafter with reference to particular non-limiting examples and to what are presently considered to be conceivable embodiments of the present invention. A person skilled in the art will appreciate that the invention is by no means limited to these examples, and may be more broadly applied.

It is to be noted that the following description of the present invention and its embodiments mainly refers to specifications being used as non-limiting examples for certain exemplary network configurations and deployments. Namely, the present invention and its embodiments are mainly described in relation to 3GPP specifications being used as non-limiting examples for certain exemplary network configurations and deployments. In particular, a WCDMA or LTE™/LTE™-Advanced communication system is used as a non-limiting example for the applicability of thus described exemplary embodiments. As such, the description of exemplary embodiments given herein specifically refers to terminology which is directly related thereto. Such terminology is only used in the context of the presented non-limiting examples, and does naturally not limit the invention in any way. Rather, any other network configuration or system deployment, etc. may also be utilized as long as compliant with the features described herein.

Hereinafter, various embodiments and implementations of the present invention and its aspects or embodiments are described using several alternatives. It is generally noted that, according to certain needs and constraints, all of the described alternatives may be provided alone or in any conceivable combination (also including combinations of individual features of the various alternatives).

It is an object of the disclosed embodiments of the present invention to address the problems described in the background section above. In particular, it is an object of these embodiments to provide an apparatus, a method and a computer program product for enabling enhanced transmitter noise shaping.

According to a first aspect of the present invention, a method comprises the steps of performing a first digital-to-analog conversion on a digital signal resulting in first analog signal, performing noise shaping on the digital signal for obtaining a noise shaped signal and performing a second digital-to-analog conversion on the noise shaped signal resulting in a second analog signal, and adding first analog signal and second analog signal for obtaining an output signal.

According to a second aspect of the present invention, an apparatus comprises at least one processor and at least one memory including computer program code, the at least one memory and the computer program code configured to, with the at least one processor, cause the apparatus at least to perform a first digital-to-analog conversion on a digital signal resulting in first analog signal, to perform noise shaping on the digital signal for obtaining a noise shaped signal and performing a second digital-to-analog conversion on the noise shaped signal resulting in a second analog signal, and to add the first analog signal and the second analog signal for obtaining an output signal.

According to a third aspect of the present invention, there is provided a computer readable medium comprising a set of instructions, which, when the instructions are run on a computer, are configured to carry out the method according to the first aspect.

Advantageous further developments or modifications of the aforementioned exemplary aspects of the present invention are set out in the dependent claims.

Generally, digital noise shaping is able to create notches in the transmitter's noise spectrum at receive frequencies to prevent jamming the receiver.

According to certain embodiments of the present invention a digital-to-analog conversion is performed at a lower sampling rate, whereas a noise shaping is performed at a higher sampling rate. Further, an up conversion to carrier frequency for the digital units is carried out, and both signals are added in the analog domain.

That is, according to certain embodiments of the present invention, only a few bits at high sampling rates are used for noise shaping. Thereby, only a narrow bit width signal is manipulated at the (high) sampling frequency of the noise shaper.

According to certain embodiments of the present invention, the above feature in is implemented in a DDRM-type transmitter, but the noise shaping scheme can be used without it in a digital-to-analog converter.

In such transmitter, signals from two digital-to-analog converters are added as analog signals (i.e. currents), and the two digital-to-analog converters may have overlapping bits.

FIG. 1 shows a principle flowchart of an example for a method according to certain embodiments of the present invention.

In Step S11, a first digital-to-analog conversion on a digital signal resulting in first analog signal is performed.

In Step S12, noise shaping on the digital signal for obtaining a noise shaped signal and performing a second digital-to-analog conversion on the noise shaped signal resulting in a second analog signal is performed.

In Step S13, the first analog signal and the second analog signal are added for obtaining an output signal.

Figure 2:
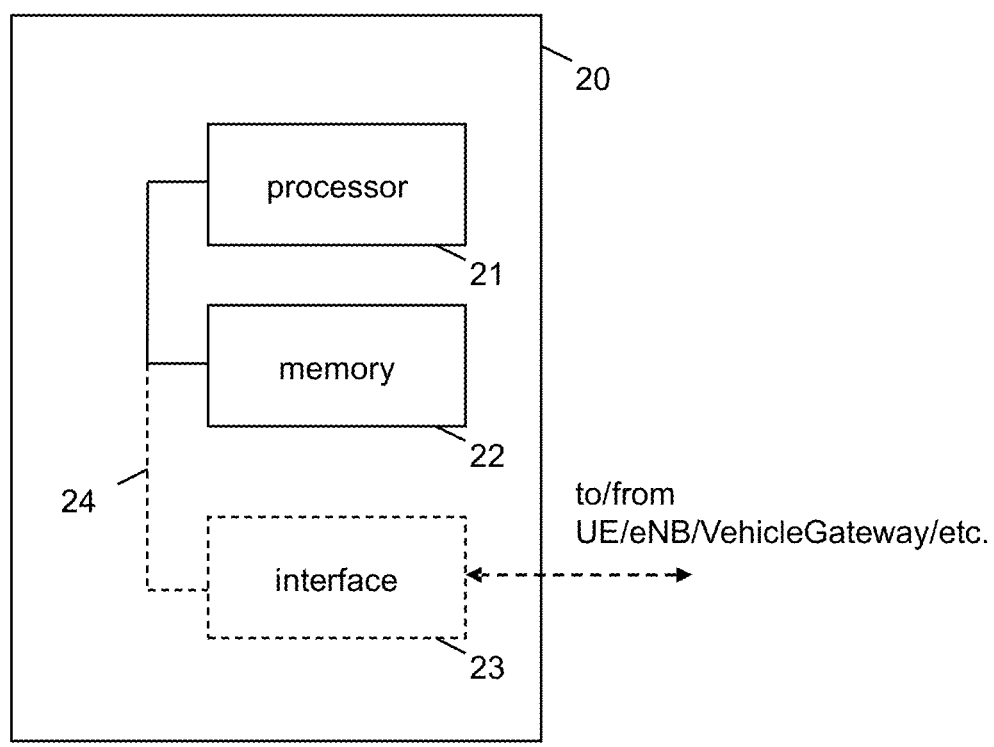
FIG. 2 shows a principle configuration of an example for an apparatus according to certain embodiments of the present invention.

FIG. 2 shows a principle configuration of an example for an apparatus according to certain embodiments of the present invention. The apparatus 20 comprises at least one processor 21 and at least one memory 22 including computer program code, which are connected by a bus 24 or the like. As indicated with a dashed line in FIG. 2, an interface 23 may optionally be connected to the bus 24 or the like, which may enable communication e.g. to/from a network entity, a base station, a user equipment UE, a vehicle gateway or the like. The at least one memory and the computer program code are arranged to, with the at least one processor, cause the apparatus at least to perform a first digital-to-analog conversion on a digital signal resulting in first analog signal, to perform noise shaping on the digital signal for obtaining a noise shaped signal and performing a second digital-to-analog conversion on the noise shaped signal resulting in a second analog signal, and to add the first analog signal and the second analog signal for obtaining an output signal.

Figure 3:
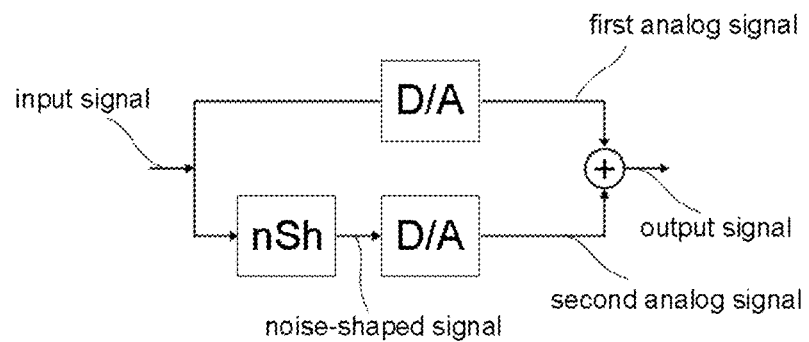
FIG. 3 is a functional scheme according to certain embodiments of the invention.

FIG. 3 shows a functional scheme according to certain embodiments of the invention. An input signal (digital signal) is, in a first branch, digital-to-analog (D/A) converted via a first digital-to-analog converter D/A, and, on a second branch, noise shaped in a noise shaper nSh, and then the noise shaped signal is digital-to-analog converted via a second digital-to-analog converter D/A. The resulting first and second analog signals are added in an adder, and output as an output signal.

According to certain embodiments of the present invention, a sample rate conversion on the digital signal prior to noise shaping is performed.

Figure 4:
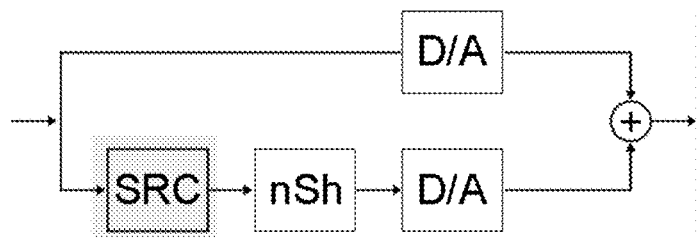
FIG. 4 is a functional scheme according to certain embodiments of the invention.

FIG. 4 shows a variation of the functional scheme shown in FIG. 3 according to certain embodiments of the invention. In particular, prior to noise shaping, a sample rate conversion SRC on the digital signal is performed.

Thereby, the second digital-to-analog conversion may be performed at a higher sampling rate than the first digital-to-analog conversion.

Figure 5:
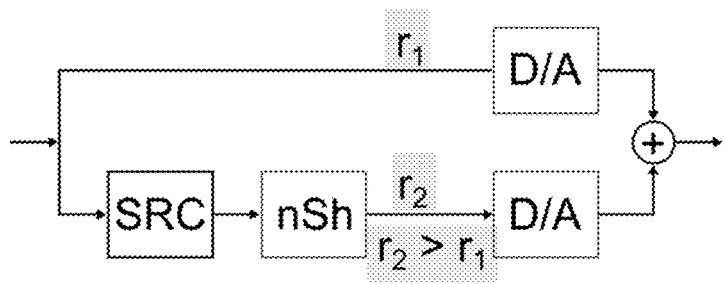
FIG. 5 is a functional scheme according to certain embodiments of the invention.

FIG. 5 shows a variation of the functional scheme shown in FIG. 4 according to certain embodiments of the invention. As is shown in FIG. 5, the sampling rate of the first branch is set to $r_1$, and the sampling rate of the second branch is set to $r_2$, wherein $r_2 > r_1$.

According to certain embodiments of the present invention, the first digital-to-analog conversion utilizes a wider bit width than the second digital-to-analog conversion.

Figure 6:
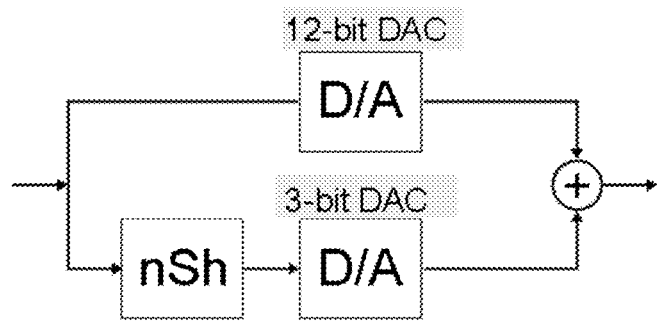
FIG. 6 is a functional scheme according to certain embodiments of the invention.

FIG. 6 shows a variation of the functional scheme shown in FIG. 3 according to certain embodiments of the invention. As non-limiting example, the first digital-to-analog conversion utilizes a bit width of 12-bit for DAC which is wider than the second digital-to-analog conversion, i.e. 3-bit.

According to certain embodiments of the present invention, an output range of the first digital-to-analog conversion is greater than an output range of the second digital-to-analog conversion.

According to certain embodiments of the present invention, a resolution of the second digital-to-analog conversion is higher than a resolution of the first digital-to-analog conversion.

According to certain embodiments of the present invention, the first and the second digital-to-analog conversion comprise overlapping bits.

Figure 7:
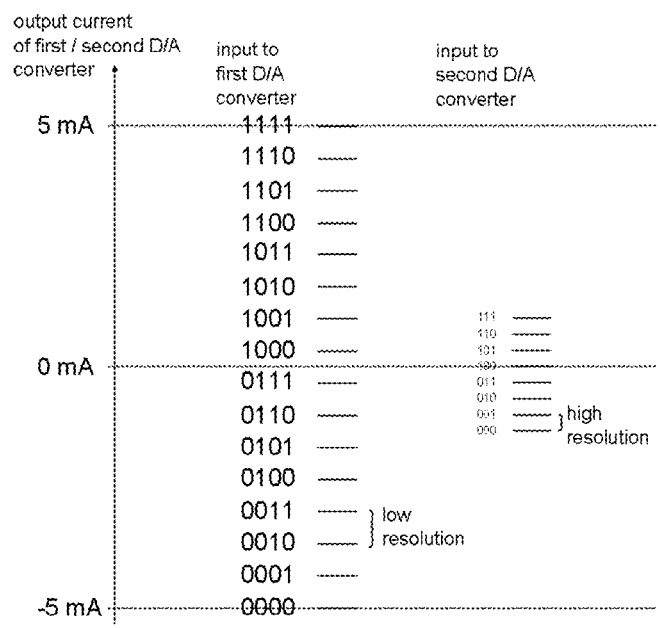
FIG. 7 shows the input/output of the first and second D/A converter according to certain embodiments of the invention.

FIG. 7 shows the input/output of the first and second D/A converter according to certain embodiments of the invention. As non-limiting example for overlapping bits in FIG. 7, a 1-bit step in the first DAC is equivalent to a two-bit step in the second DAC.

According to certain embodiments of the present invention, the first and the second digital-to-analog conversion comprise a frequency translation.

Figure 8:
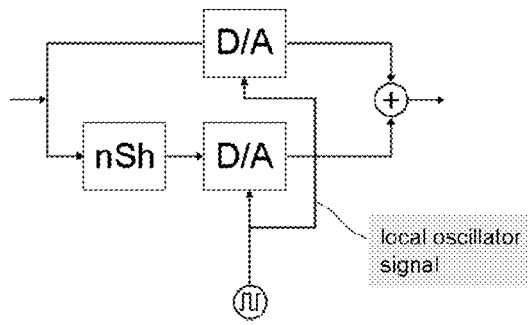
FIG. 8 is a functional scheme according to certain embodiments of the invention.

FIG. 8 shows a variation of the functional scheme shown in FIG. 3 according to certain embodiments of the invention, wherein a local oscillator signal is input to each of the first and second digital-to-analog converters D/A for frequency translation.

Thereby, the frequency translation may comprise switching at least one of first and second digital-to-analog conversion with a local oscillator signal. Further, the switching may comprise reversing a polarity of an analog signal.

According to certain embodiments of the present invention, a quantization and a determination of a quantization error is performed, wherein the noise shaping is performed on the determined quantization error.

Figure 9:
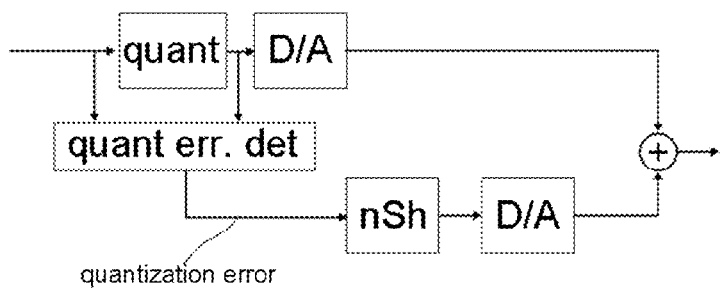
FIG. 9 is a functional scheme according to certain embodiments of the invention.

FIG. 9 shows a variation of the functional scheme shown in FIG. 3 according to certain embodiments of the invention. A quantization error is determined based on comparing the input and output of the quantizer, and the resulting quantization error is input to the noise shaper nSh for noise shaping.

According to certain embodiments of the present invention, the first digital-to-analog conversion comprises a sample-and-hold operation, and the second digital-to-analog conversion performs multiple conversions over one hold time interval of the sample and hold operation.

Figure 10:
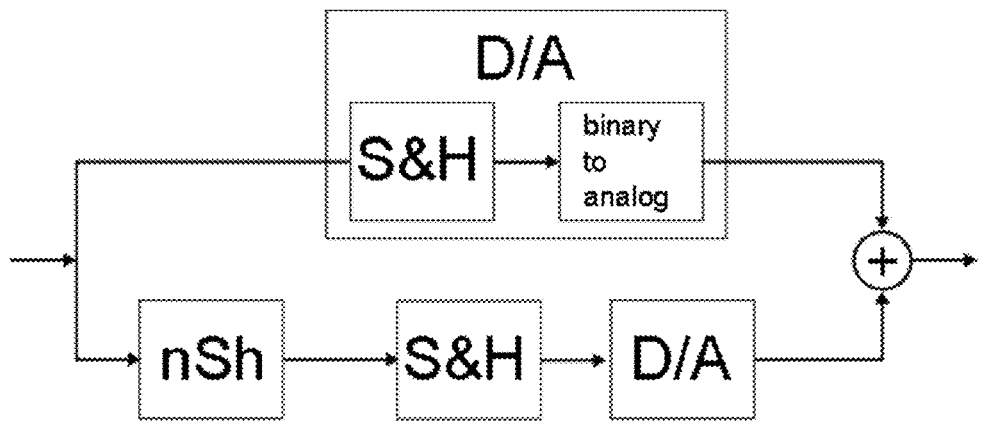
FIG. 10 is a functional scheme according to certain embodiments of the invention.

FIG. 10 shows a variation of the functional scheme shown in FIG. 3 according to certain embodiments of the invention, wherein the first digital-to-analog converter D/A (upper branch) comprises a sample-and-hold unit S&H and a binary to analog conversion unit, and the second digital-to-analog converter D/A (lower branch) performs multiple conversions over one hold time interval of the sample and hold operation by a second sample and hold unit S&H.

All the mentioned embodiments can be formed in several alternatives as illustrated but not limited to the implementation examples shown below.

Figure 11A:
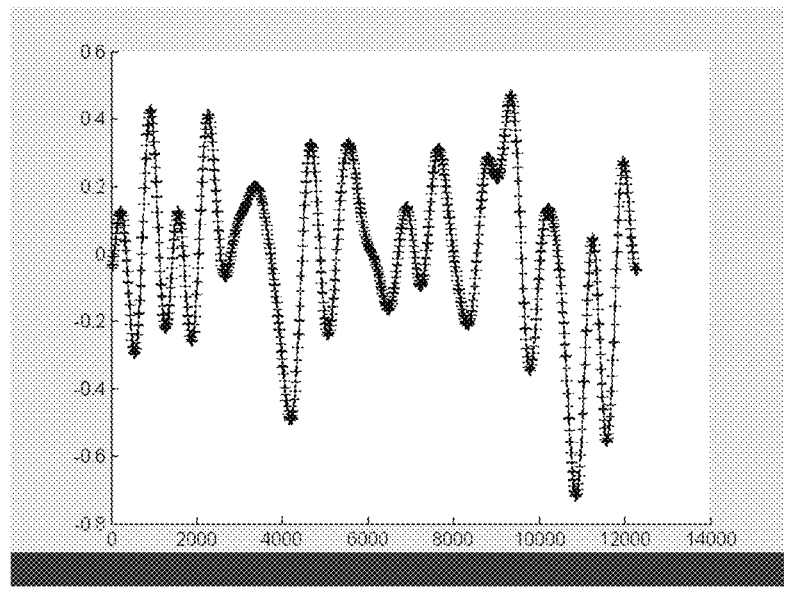
FIGS. 11a and 11b show an example signal for illustrating the concept according to certain embodiments of the present invention.
Figure 11B:
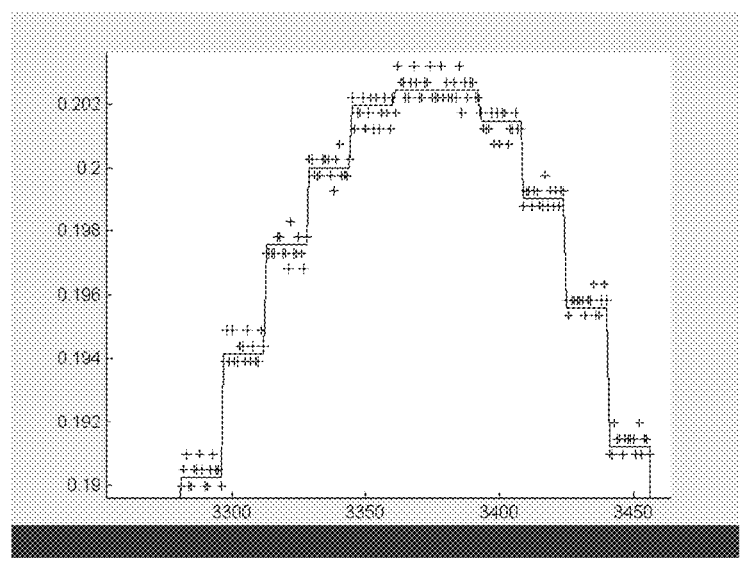

FIGS. 11a and 11b show an example signal to illustrate the concept.

The signal waveform (straight line) is converted to analog at a low rate, using a sample-and-hold stage. The noise shaping signal is converted at a higher rate, and added (result: cross symbols).

Figure 12:
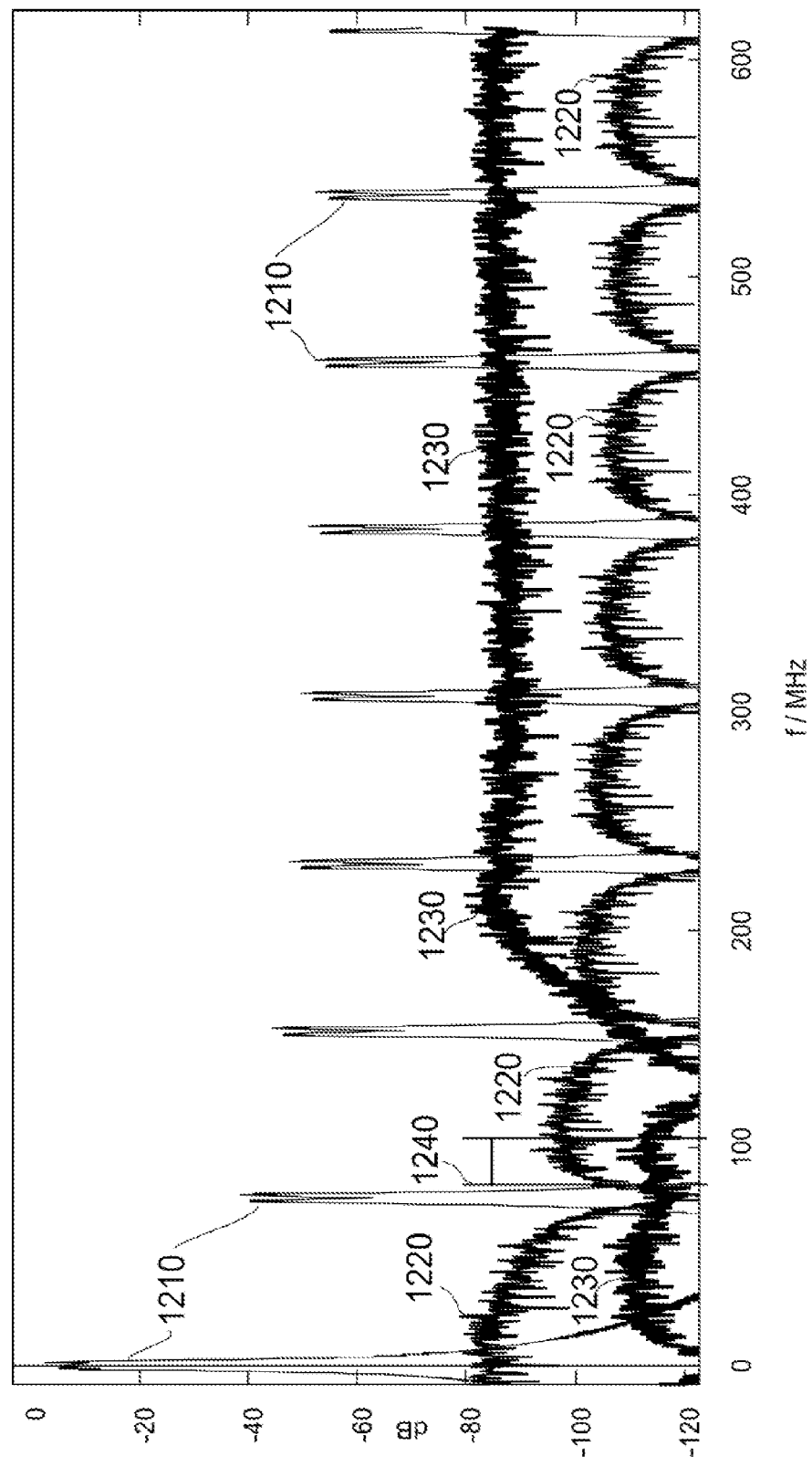
FIG. 12 shows the spectrum of the resulting output signal of FIGS. 11a and 11b.

The spectrum of the resulting output signal can be seen in FIG. 12. Trace 1210 shows input signal, processed by a sample-and-hold stage of a digital-to-analog converter with infinite resolution (no quantization error) operating at 76.8 MSPS. Trace 1220 shows the isolated quantization error, which results from performing the processing with a finite number of bits. Frequency span 1240 illustrates a frequency band of a FDD receiver. Quantization error 1220 appears in frequency span 1240 at a level of approx. −95 dB. Trace 1230 illustrates the isolated, remaining quantization error in the output signal after noise shaping according to certain embodiments of the present invention, at a level of approx. −110 dB. Comparing traces 1220 and 1230 shows a reduction of quantization noise in frequency span 1240 of approx. 15 dB.

The shape of the quantization error 1230 can be designed arbitrarily with standard methods, preferably within the limits of the Gerzon-Craven noise shaping theorem and using an acceptable filter complexity.

According to certain embodiments of the present invention, as possible implementation of the present invention, the input signal is quantized at a "mid" sampling rate, which is typically higher than the input rate, but lower than the noise shaper's rate.

The quantization error is determined and input to a noise shaper that operates at a higher rate and lower bit width than the main DAC. The output signal of the noise shaper is separately converted to an analog signal and added, i.e. as a current from a current-steering Digital-Analog-Converter DAC to the output signal.

According to certain embodiments, the structure may be combined with a direct digital-to-RF ("DDRM") transmitter.

Figure 13:
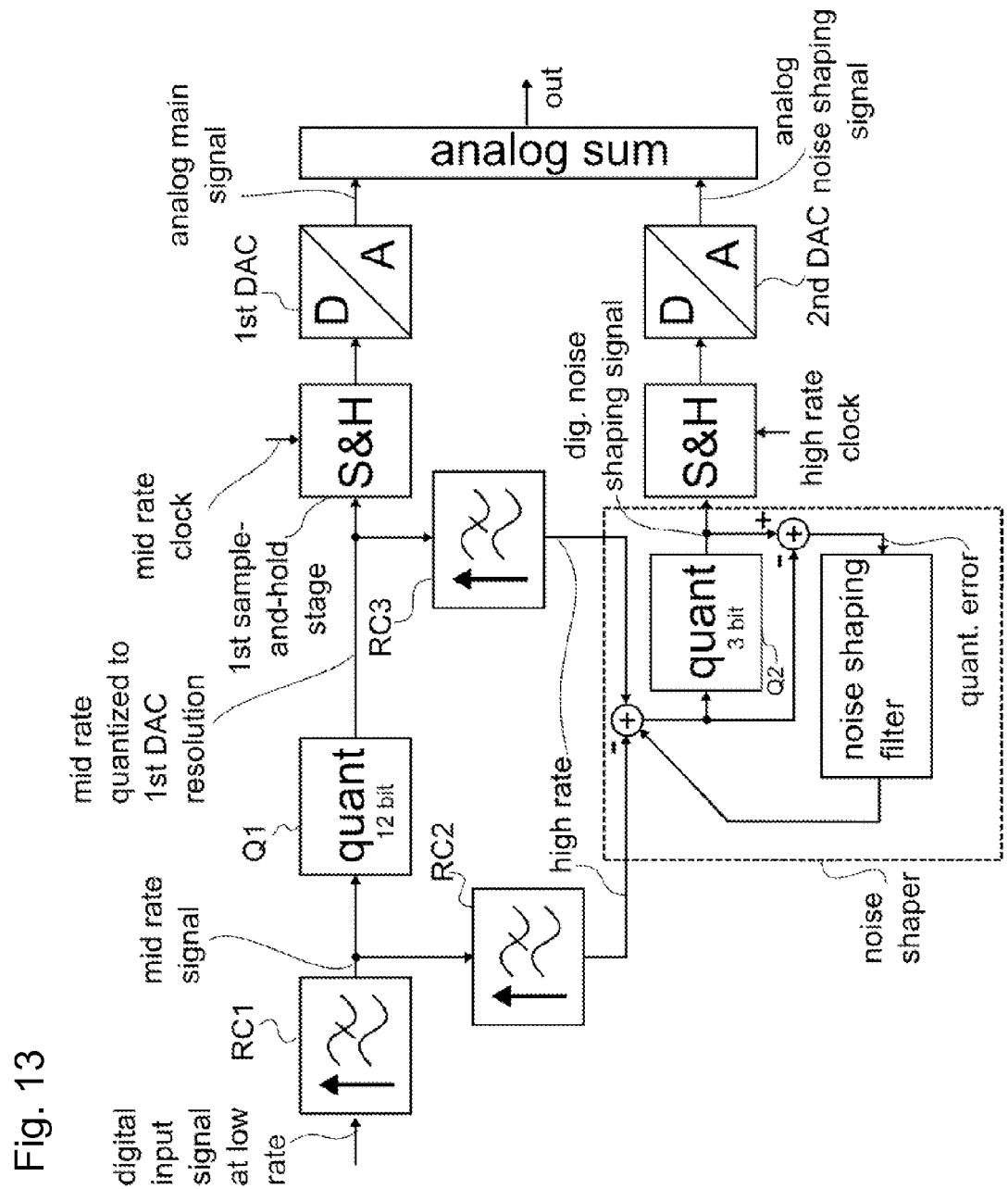
FIG. 13 schematically shows a control scheme according to certain embodiments of the present invention.

FIG. 13 schematically shows a control scheme according to certain embodiments of the present invention.

A digital input signal at a low rate is resampled to a mid-rate signal in a first sample rate converter RC1. In the upper branch shown in FIG. 13, the mid-rate signal is put into a first quantizer Q1, where the mid-rate signal is quantized to the resolution of a $1^{st}$ DAC, e.g. to 12 bits. Further, the mid-rate quantized signal is processed with a first sample-and-hold (S&H) stage (such as a digital register) and digital-to-analog converted into an analog main signal by means of a $1^{st}$ digital-to-analog converter (D/A).

In the lower branch shown in FIG. 13, a noise shaper (indicated by a dashed box) comprises a first summer, a second quantizer Q2 e.g. with 3 bit resolution, a noise shaping filter and a second summer. The mid-rate signal of the upper branch is converted to a high sample rate in a second sample rate converter RC2 and input to the first summer with negative sign. Further, the mid-rate quantized signal of the upper branch is converted to the high sample rate in a third sample rate converter RC3 and input to the first summer. Additionally, the output of the noise shaping filter is input to the first summer.

The output of the first summer is quantized with a second quantizer Q2 into a digital noise shaping signal and converted at the high clock rate into an analog noise shaping signal by means of a second sample-and-hold stage, for example a digital register, and a $2^{nd}$ DAC. The digital noise shaping signal as well as the inverted output of the first summer is further input to the second summer, and the output thereof is forwarded to the noise shaping filter.

Finally, the analog main signal and the analog noise shaping signal are summed and output.

In an example embodiment of the invention, both main analog signal and analog noise shaping signal are generated (by $1^{st}$ and $2^{nd}$ DAC, respectively) in the current domain and summed by feeding both currents into a common node.

In an example embodiment of the invention, $1^{st}$ and $2^{nd}$ DAC are current steering DACs that steer variable portions of a direct current to an output node.

In another example embodiment of the invention, $1^{st}$ and $2^{nd}$ DAC are current steering DACs that steer variable portions of a local oscillator signal to an output node (known as "direct-to-digital" or DAX conversion).

In an example embodiment of the invention, the first sample-and-hold stage converts a discrete-time signal into a continuous-time signal and the first digital-to-analog converter converts a discrete-value signal (such as a binary or thermometer-encoded format) into a continuous-value signal (such as an analog voltage or current). Similar principles may apply to second sample-and-hold stage and second digital-to-analog converter.

According to certain embodiments of the present invention, two DACs comprise overlapping bits. In the simulation shown in FIG. 13, the upper (signal) DAC processes bits 11 . . . 0. The lower (noise shaping) DAC processes bits 2 . . . 0, thus the DACs overlap in bits 0 . . . 2.

An alternative embodiment processes bits 11 . . . 1 in the signal DAC, and bits 3 . . . 0 in the noise shaping DAC. Now the DACs overlap in bits 1 . . . 3.

Certain embodiments of the present invention provide the advantage that only a narrow bit width signal is manipulated at the (high) sampling frequency of the noise shaper. In the embodiment shown in FIG. 5, the noise shaper uses 3 bits vs. 12 bits in the main DAC). The lower bits in a DAC are physically small and easily replicated for the noise shaper.

Furthermore, known digital noise shaping technique is used to reduce the noise at critical frequencies already at the output of the D/A-conversion (and upconversion).

Still further, increased noise floor outside the critical frequencies can be tolerated.

Additionally, relaxed RF-filtering for a DDRM transmitter is possible.

According to certain embodiments, the noise shaping loop (dashed block in FIG. 13: 3-bit quantizer and filter) may be implemented without pipelining (no extra delay allowed). This will define the highest practical sampling rate in the noise shaping branch, which may scale (improve) with future CMOS process generations.

Figure 14A:
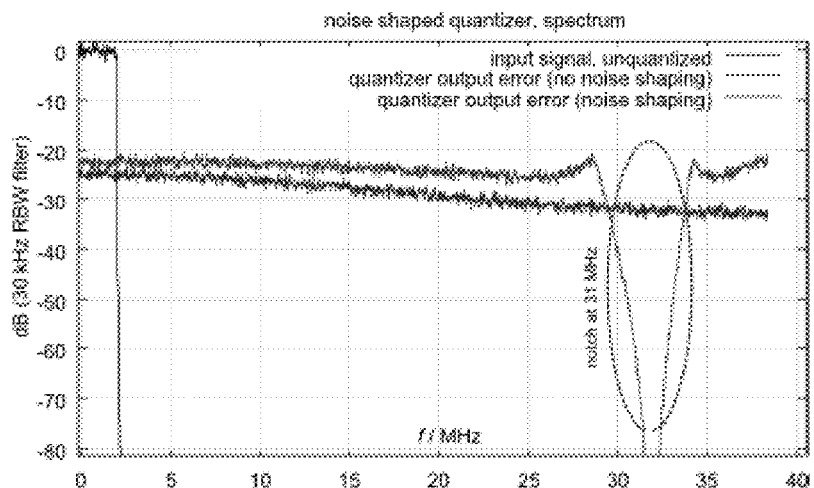
FIGS. 14a and 14b show a quantized output spectrum with and without noise shaping according to [3] and a general structure of a noise shaper with Sigma-Delta DACs according to [2].

FIG. 14a shows a quantized output spectrum with and without noise shaping according to [3]. The bold trace shows a noise-shaped DAC quantization spectrum with a notch at 31 MHz that prevents jamming of a receiver in LTE band 13 (having a duplex spacing of 31 MHz).

Figure 14B:
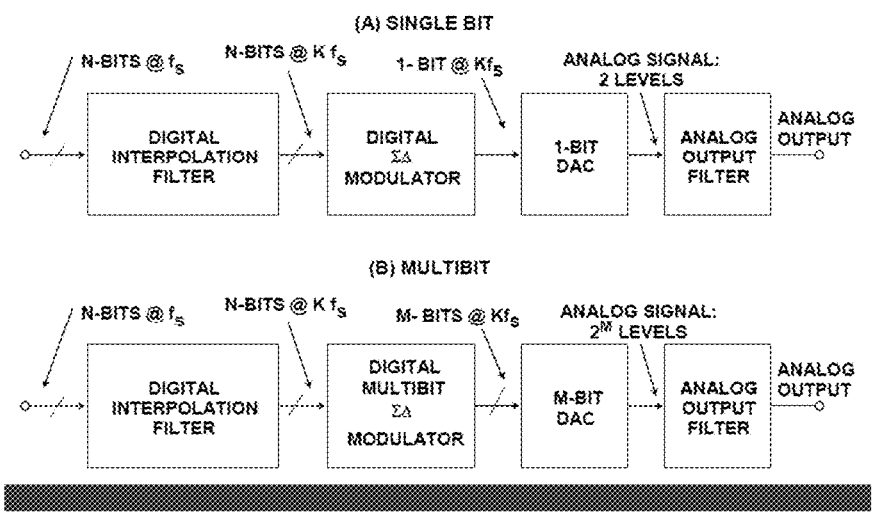

Further, FIG. 14b shows a general structure of a noise shaper with Sigma-Delta DACs according to [2]. A noise shaper (sigma-delta modulator) is used before a single DAC (1-bit or M-bit). The disadvantage is that the M-bit DAC needs to operate at the high rate of the noise shaper in its whole bit width.

In the foregoing exemplary description of the apparatus, only the units that are relevant for understanding the principles of the invention have been described using functional blocks. The apparatuses may comprise further units that are necessary for its respective function. However, a description of these units is omitted in this specification. The arrangement of the functional blocks of the apparatuses is not construed to limit the invention, and the functions may be performed by one block or further split into sub-blocks.

According to exemplarily embodiments of the present invention, a system may comprise any conceivable combination of the thus depicted devices/apparatuses and other network elements, which are arranged to cooperate as described above.

Embodiments of the present invention may be implemented in software, hardware, application logic or a combination of software, hardware and application logic. The software, application logic and/or hardware generally, but not exclusively, may reside on the devices' modem module. In an example embodiment, the application logic, software or an instruction set is maintained on any one of various conventional computer-readable media. In the context of this document, a "computer-readable medium" may be any media or means that can contain, store, communicate, propagate or transport the instructions for use by or in connection with an instruction execution system, apparatus, or device, such as a computer or smart phone, or user equipment.

As used in this application, the term "circuitry" refers to all of the following: (a) hardware-only circuit implementations (such as implementations in only analog and/or digital circuitry) and (b) to combinations of circuits and software (and/or firmware), such as (as applicable): (i) to a combination of processor(s) or (ii) to portions of processor(s)/software (including digital signal processor(s)), software, and memory (ies) that work together to cause an apparatus, such as a mobile phone or server, to perform various functions) and (c) to circuits, such as a microprocessor(s) or a portion of a microprocessor(s), that require software or firmware for operation, even if the software or firmware is not physically present. This definition of 'circuitry' applies to all uses of this term in this application, including in any claims. As a further example, as used in this application, the term "circuitry" would also cover an implementation of merely a processor (or multiple processors) or portion of a processor and its (or their) accompanying software and/or firmware. The term "circuitry" would also cover, for example and if applicable to the particular claim element, a baseband integrated circuit or applications processor integrated circuit for a mobile phone or a similar integrated circuit in server, a cellular network device, or other network device.

Embodiments of the present invention relate in particular but without limitation to wireless chipsets for use in mobile communications, for example to environments under LTE, LTE-A, WCDMA, WIMAX and WLAN and can advantageously be implemented in user equipments or smart phones, or personal computers connectable to such networks. That is, it can be implemented as/in chipsets to connected devices, and/or modems thereof.

According to certain embodiments of the present invention, user equipment may refer to a portable computing device. Such computing devices include wireless mobile communication devices operating with or without a subscriber identification module (SIM), including, but not limited to, the following types of devices: mobile phone, smartphone, personal digital assistant (PDA), handset, laptop computer.

If desired, the different functions discussed herein may be performed in a different order and/or concurrently with each other. Furthermore, if desired, one or more of the above-described functions may be optional or may be combined.

Although various aspects of the invention are set out in the independent claims, other aspects of the invention comprise other combinations of features from the described embodiments and/or the dependent claims with the features of the independent claims, and not solely the combinations explicitly set out in the claims.

It is also noted herein that while the above describes example embodiments of the invention, these descriptions should not be viewed in a limiting sense. Rather, there are several variations and modifications which may be made without departing from the scope of the present invention as defined in the appended claims.

The following meanings for the abbreviations used in this specification apply:
3GPP 3rd Generation Partnership Project
D/A: Digital to analog
DAC: Digital-to-analog converter
DAX: Direct-to-digital conversion
DDRM: Direct-digital RF modulator
eNB Enhanced Node B
LTE Long Term Evolution
LTE-A Long Term Evolution Advanced
S&H: Sample-and-hold
UE User Equipment

What is claimed is:

1. A method, comprising:
performing a first digital-to-analog conversion on a digital signal resulting in first analog signal;
performing noise shaping on the digital signal for obtaining a noise shaped signal and performing a second digital-to-analog conversion on the noise shaped signal resulting in a second analog signal; and
adding the first analog signal and the second analog signal for obtaining an output signal, wherein at least one of the following is satisfied:
   the method further comprises performing a sample rate conversion on the digital signal prior to noise shaping,
   the first digital-to-analog conversion utilizes a wider bit width than the second digital-to-analog conversion,
   an output range of the first digital-to-analog conversion is greater than an output range of the second digital-to-analog conversion,
   a resolution of the second digital-to-analog conversion is higher than a resolution of the first digital-to-analog conversion,
   the first and second digital-to-analog conversion comprise overlapping bits,
   the first and the second digital-to-analog conversion comprise a frequency translation,
   the method further comprises performing a quantization and a determination of a quantization error, wherein the noise shaping is performed on the determined quantization error, or
   the first digital-to-analog conversion comprises a sample-and-hold operation, and the second digital-to-analog conversion performs multiple conversions over one hold time interval of the sample and hold operation.

2. The method according to claim 1, further comprising: performing the sample rate conversion on the digital signal prior to noise shaping.

3. The method according to claim 2, wherein the second digital-to-analog conversion is performed at a higher sampling rate than the first digital-to-analog conversion.

4. The method according to claim 1, wherein the first digital-to-analog conversion utilizes the wider bit width than the second digital-to-analog conversion.

5. The method according to claim 1, wherein the output range of the first digital-to-analog conversion is greater than the output range of the second digital-to-analog conversion.

6. The method according to claim 1, wherein the resolution of the second digital-to-analog conversion is higher than the resolution of the first digital-to-analog conversion.

7. The method according to claim 1, wherein first and second digital-to-analog conversion comprise overlapping bits.

8. An apparatus comprising:
   circuitry configured to perform:
      a first digital-to-analog conversion on a digital signal resulting in first analog signal;
      noise shaping on the digital signal for obtaining a noise shaped signal and performing a second digital-to-analog conversion on the noise shaped signal resulting in a second analog signal; and
      adding the first analog signal and the second analog signal for obtaining an output signal, wherein
   at least one of the following is satisfied:
      the circuitry is further configured to perform a sample rate conversion on the digital signal prior to noise shaping,
      the second digital-to-analog conversion is performed at a higher sampling rate than the first digital-to-analog conversion,
      the first digital-to-analog conversion utilizes a wider bit width than the second digital-to-analog conversion,
      an output range of the first digital-to-analog conversion is greater than an output range of the second digital-to-analog conversion,
      a resolution of the second digital-to-analog conversion is higher than a resolution of the first digital-to-analog conversion,
      the first and the second digital-to-analog conversion comprise overlapping bits,
      the first and the second digital-to-analog conversion comprise a frequency translation,
      the circuitry is further configured to perform a quantization and a determination of a quantization error, wherein the noise shaping is performed on the determined quantization error, or
      the first digital-to-analog conversion comprises a sample-and-hold operation, and the second digital-to-analog conversion performs multiple conversions over one hold time interval of the sample and hold operation.

9. The apparatus according to claim 8, wherein the circuitry is further configured to perform the sample rate conversion on the digital signal prior to noise shaping.

10. The apparatus according to claim 9, wherein the second digital-to-analog conversion is performed at the higher sampling rate than the first digital-to-analog conversion.

11. The apparatus according to claim 8, wherein the first digital-to-analog conversion utilizes the wider bit width than the second digital-to-analog conversion.

12. The apparatus according to claim 8, wherein the output range of the first digital-to-analog conversion is greater than the output range of the second digital-to-analog conversion.

13. The apparatus according to claim 8, wherein the resolution of the second digital-to-analog conversion is higher than the resolution of the first digital-to-analog conversion.

14. The apparatus according to claim 8, wherein the first and the second digital-to-analog conversion comprise overlapping bits.

15. The apparatus according to claim 8, wherein the first and the second digital-to-analog conversion comprise the frequency translation.

16. The apparatus according to claim 15, wherein the frequency translation comprises switching at least one of the first and the second digital-to-analog conversion with a local oscillator signal.

17. The apparatus according to claim 16, wherein the switching comprises reversing a polarity of an analog signal.

18. The apparatus according to claim 8, wherein the circuitry is further configured to perform the quantization and the determination of the quantization error, wherein the noise shaping is performed on the determined quantization error.

19. The apparatus according to claim 8, wherein the first digital-to-analog conversion comprises the sample-and-hold operation, and the second digital-to-analog conversion performs multiple conversions over one hold time interval of the sample and hold operation.

20. A computer readable medium memory comprising a set of instructions, which, when executed by circuitry, cause the circuitry to at least:
   perform a first digital-to-analog conversion on a digital signal resulting in first analog signal;
   perform noise shaping on the digital signal for obtaining a noise shaped signal and performing a second digital-to-analog conversion on the noise shaped signal resulting in a second analog signal; and
   add the first analog signal and the second analog signal for obtaining an output signal, wherein
   at least one of the following is satisfied:
      the instructions further cause the circuitry to perform a sample rate conversion on the digital signal prior to noise shaping,
      the second digital-to-analog conversion is performed at a higher sampling rate than the first digital-to-analog conversion, the first digital-to-analog conversion utilizes a wider bit width than the second digital-to-analog conversion, an output range of the first digital-to-analog conversion is greater than an output range of the second digital-to-analog conversion, a resolution of the second digital-to-analog conversion is higher than a resolution of the first digital-to-analog conversion, the first and the second digital-to-analog conversion comprise overlapping bits, the first and the second digital-to-analog conversion comprise a frequency translation, the instructions further cause the circuitry to perform a quantization and a determination of a quantization error, wherein the noise shaping is performed on the determined quantization error, or the first digital-to-analog conversion comprises a sample-and-hold operation, and the second digital-to-analog conversion performs multiple conversions over one hold time interval of the sample and hold operation.

* * * * *